(12) United States Patent
Carroll et al.

(10) Patent No.: US 10,243,397 B2
(45) Date of Patent: Mar. 26, 2019

(54) DATA CENTER POWER DISTRIBUTION

(71) Applicant: Lifeline IP Holdings, LLC, Carmel, IN (US)

(72) Inventors: Alex J. Carroll, Carmel, IN (US); Richard L. Banta, Carmel, IN (US)

(73) Assignee: Lifeline IP Holdings, LLC, Connersville, IN (US)

( * ) Notice: Subject to any disclaimer, the term of this patent is extended or adjusted under 35 U.S.C. 154(b) by 205 days.

(21) Appl. No.: 15/049,065

(22) Filed: Feb. 20, 2016

(65) Prior Publication Data
US 2016/0248273 A1 Aug. 25, 2016

Related U.S. Application Data

(60) Provisional application No. 62/118,724, filed on Feb. 20, 2015.

(51) Int. Cl.
| | |
|---|---|
| *H02J 1/10* | (2006.01) |
| *H02J 3/38* | (2006.01) |
| *H02J 9/00* | (2006.01) |
| *H02J 9/06* | (2006.01) |
| *H05K 7/20* | (2006.01) |
| *G06F 1/30* | (2006.01) |

(Continued)

(52) U.S. Cl.
CPC ............... *H02J 9/061* (2013.01); *G06F 1/20* (2013.01); *G06F 1/30* (2013.01); *H05K 7/1498* (2013.01); *H05K 7/20745* (2013.01); *H05K 7/20827* (2013.01); *G06F 2200/201* (2013.01)

(58) Field of Classification Search
CPC . H02J 9/061; H05K 7/20745; H05K 7/20827; H05K 7/1498; G06F 2200/201; G06F 1/30; G06F 1/20
See application file for complete search history.

(56) References Cited

U.S. PATENT DOCUMENTS

| | | | |
|---|---|---|---|
| 6,118,186 A * | 9/2000 | Scott | H02P 9/04 290/1 A |
| 6,967,283 B2 | 11/2005 | Radmussen et al. | |
| 8,195,340 B1 | 6/2012 | Haney et al. | |

(Continued)

FOREIGN PATENT DOCUMENTS

EP 2852094 A1 3/2015

*Primary Examiner* — Alfonso Perez Borroto
*Assistant Examiner* — Esayas Yeshaw
(74) *Attorney, Agent, or Firm* — Taft Stettinius & Hollister LLP

(57) ABSTRACT

A data center power distribution system is disclosed. Utility power normally supports the devices (load) in the data center, but when utility power fails, backup energy from a generator and/or flywheel smooths out the supply. Each utility main/backup combination feeds one or more breakers, and each breaker supplies power to two or more servers, where each server receives redundant power input from to such breaker paths. In some embodiments, synchronization buses are absent between the breaker and the server. Redundant and well valved plumbing leads chilled supply water from chiller plants to air handlers (in some embodiments, through an isolation manifold) and back while enabling isolation of leaks and equipment failures. A special air handler design contains water and efficiently moves cooled air into the operational space of the data center.

20 Claims, 8 Drawing Sheets

(51) Int. Cl.
*H05K 7/14* (2006.01)
*G06F 1/20* (2006.01)

(56) References Cited

U.S. PATENT DOCUMENTS

| | | | |
|---|---|---|---|
| 8,333,316 B2 | 12/2012 | Heath et al. | |
| 8,595,515 B1 | 11/2013 | Weber et al. | |
| 8,621,248 B1* | 12/2013 | Weber | G06F 1/3206 713/300 |
| 9,218,237 B1 | 12/2015 | Wishman | |
| 2008/0016452 A1* | 1/2008 | Pincus | H02J 13/001 715/763 |
| 2009/0078401 A1 | 3/2009 | Cichanowicz | |
| 2009/0259345 A1* | 10/2009 | Kato | G06F 1/20 700/295 |
| 2010/0142108 A1* | 6/2010 | Faulkner | H02B 7/06 361/62 |
| 2010/0185336 A1* | 7/2010 | Rovnyak | H02J 3/38 700/287 |
| 2013/0019124 A1* | 1/2013 | Grimshaw | G06F 11/2015 714/24 |
| 2013/0293017 A1* | 11/2013 | Englert | H02J 9/04 307/65 |
| 2014/0015324 A1* | 1/2014 | Brennan | H02J 3/383 307/72 |
| 2014/0355610 A1* | 12/2014 | Ge | H04B 3/542 370/392 |
| 2015/0001942 A1* | 1/2015 | Fang | H02J 7/00 307/64 |
| 2015/0061384 A1* | 3/2015 | Towner | H02J 1/10 307/23 |
| 2015/0096171 A1* | 4/2015 | Krapf | H02J 9/066 29/825 |

* cited by examiner

DATA CENTER POWER DISTRIBUTION

CROSS-REFERENCE TO RELATED APPLICATION

This application claims priority to U.S. Provisional Patent Application No. 62/118,724, filed on Feb. 20, 2015, with title "Data Center Power Distribution System," the whole document being incorporated herein by reference.

FIELD

The present systems and methods relate to the design, operation, and maintenance of data center facilities. More specifically, the present systems and methods relate to reliable techniques and systems for handling power, cooling, maintenance, and monitoring of a data center.

DESCRIPTION

Figure 1:
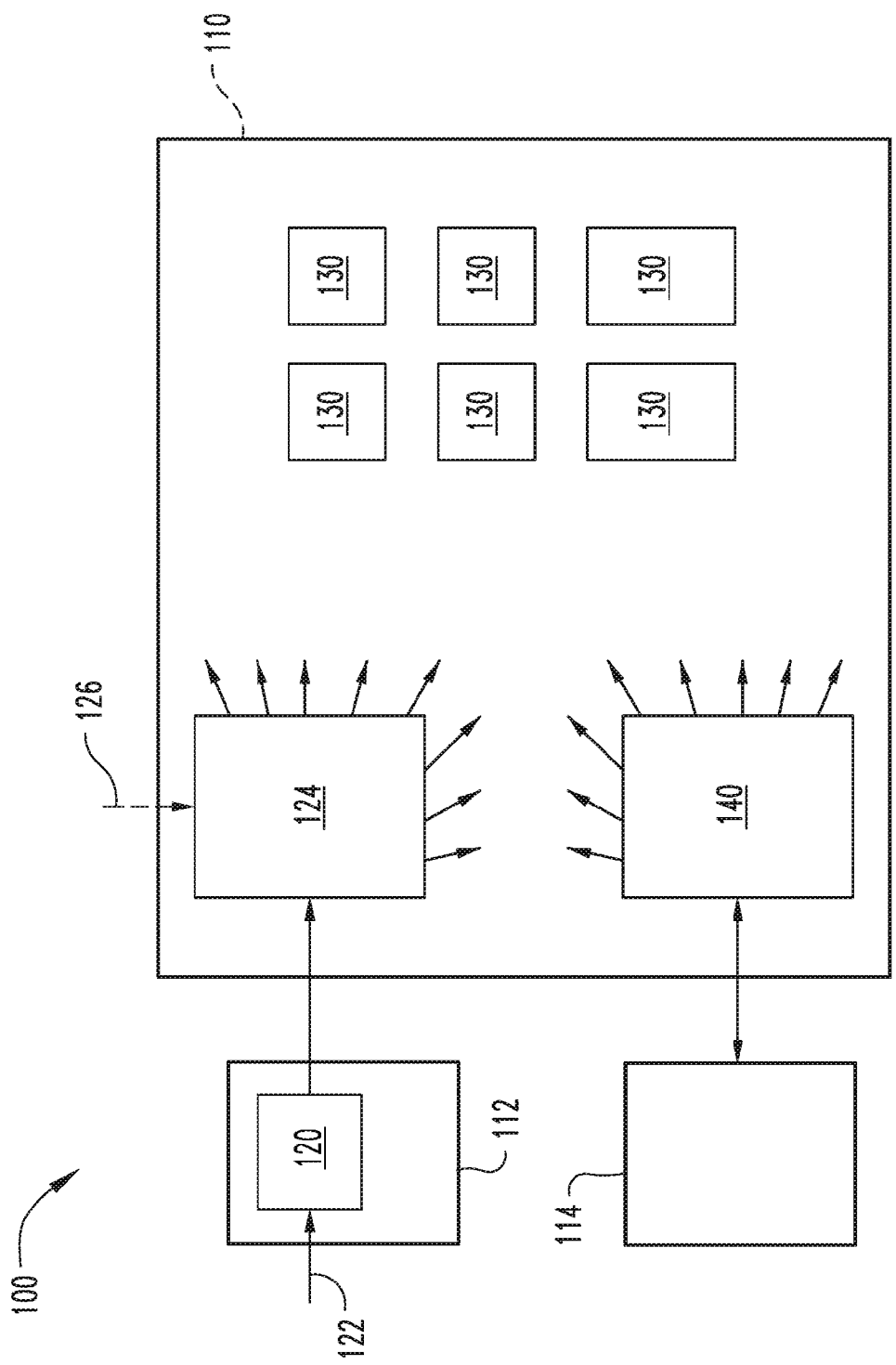
FIG. 1 is a schematic view of several of a data center's systems according to one embodiment of the present system.

For the purpose of promoting an understanding of the principles of the present invention, reference will now be made to the embodiment illustrated in the drawings and specific language will be used to describe the same. It will, nevertheless, be understood that no limitation of the scope of the invention is thereby intended; any alterations and further modifications of the described or illustrated embodiments, and any further applications of the principles of the invention as illustrated therein are contemplated as would normally occur to one skilled in the art to which the invention relates.

Generally, one form of the present system is a data center power distribution system that provides each unit of IT equipment a plurality of power sources operating as independently as possible, conceptually in "silos," such that a failure in one is unlikely to affect the other. Human activities monitoring and maintaining these data center systems are documented to provide evidence of compliance with contractual and regulatory obligations as the facility is operated and maintained.

Turning to FIG. 1, exemplary data center 100 is illustrated schematically to include main building 110 and outbuilding 112. Outbuilding 112 houses power supply and control equipment 120. In some embodiments, utility power comes into main building 110 through connection 126 for management by power distribution and control equipment 124, which is also connected to power supply and control equipment 120, before being distributed to load systems 130 through power distribution system 124. In some alternative embodiments, utility power enters outbuilding 112 through connection 122, is managed by power supply and control equipment 120, and enters main building 110 for management by power distribution and control equipment 124.

External HVAC equipment 114 includes heat exchangers and the like to complement the indoor components 140 of the cooling system. Indoor components 140 circulate cool air around load devices 130. Distribution of power to HVAC equipment 114 and indoor components 140 is discussed further below.

Figure 2:
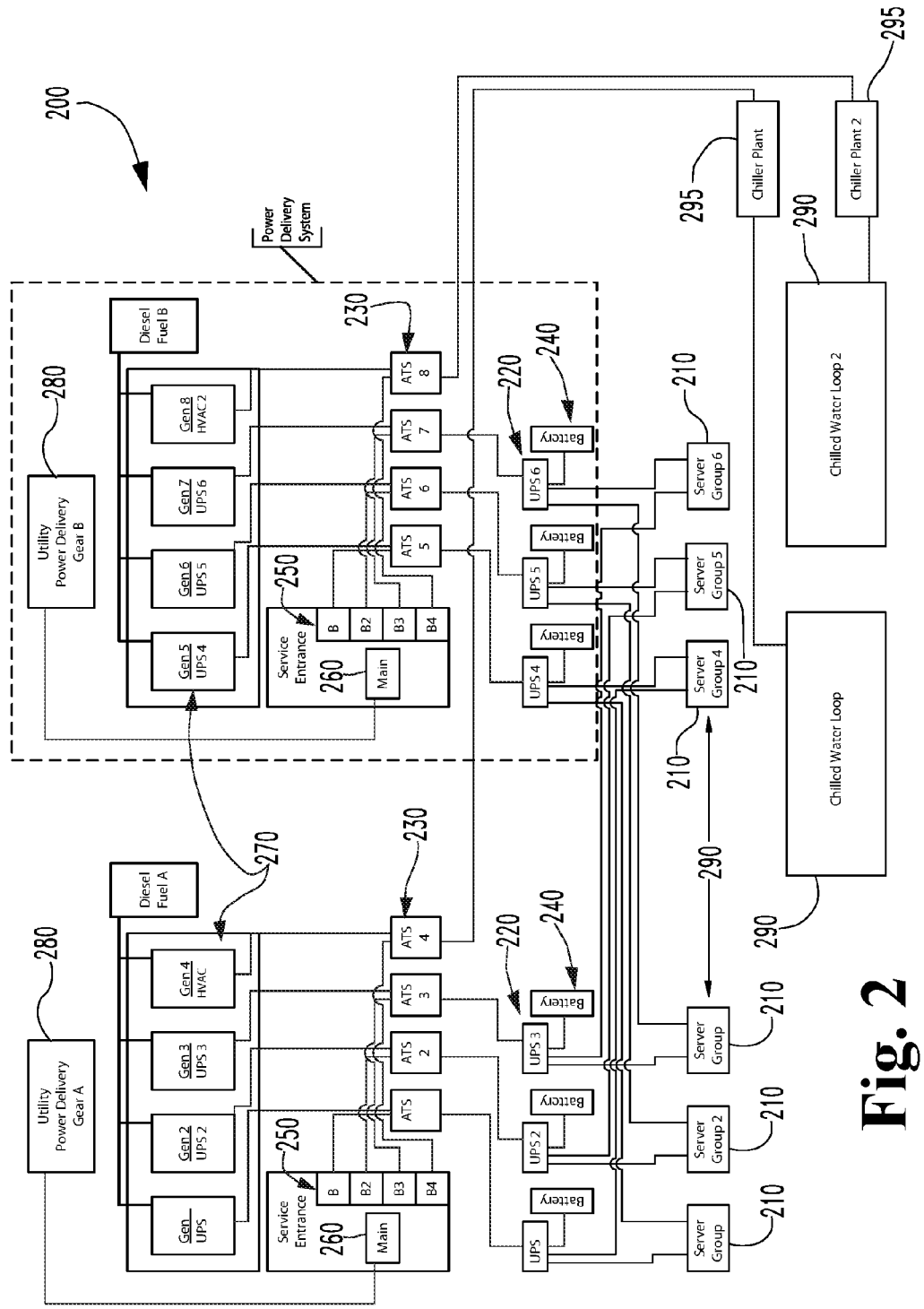
FIG. 2 is a schematic view of a power distribution system for the data center illustrated in FIG. 1.

As shown in FIG. 2, exemplary data center power distribution system 200 facilitates operation of a number of load devices ("servers" or "server groups" herein, though other types of equipment, and/or a homogeneous or heterogeneous set of different kinds of equipment, might operate in power distribution system 200 as a single load device) 210. Each server group 210 is powered by at least two uninterruptible power supplies (UPSs) 220. In the illustrated embodiment, each UPS 220 has two managed-power outputs, each of which is connected to a power input of a server group 210, and each server group 210 receives power from two different UPSs. Thus, in this embodiment, the number of managed-power outputs of UPSs 220 in the system is equal to the number of server groups 210, though additional UPSs 220 are often placed into the system for ready connection to new server groups 210 as they are provisioned. Further, each UPS 220 in other embodiments has a different number of managed-power outputs, so the proportion of UPSs 220 to server groups 210 is also different. Each UPS 220 in the illustrated embodiment is an off-the-shelf UPS with output lines and sufficient available output current for supplying sufficient power to at least two servers. The 9800B UPS available from Mitsubishi is one such UPS. In other embodiments, the collection of UPSs 220 is heterogeneous in capacity and/or manufacturer and model, while in still others, all of the UPSs 220 are the same.

In the configuration illustrated in FIG. 2, each UPS 220 receives power from a dedicated automatic transfer switch (ATS) 230 and maintains reserve energy in a dedicated battery 240. In the illustrated embodiment, each ATS 230 is a 300 Series open transition ATS provided by ASCO, though other devices will be used in other implementations as will occur to those skilled in the art. Further, each battery 240 comprises a plurality of automotive batteries, such as 12-volt Unigy Series batteries available from Deka. In other embodiments, other kinds of energy storage devices are used in place of batteries 240 as will occur to those skilled in the art.

During normal operation, each ATS 230 receives electricity from a utility power delivery gear 280 via a (utility) power main connection 260 and a breaker 250. Each ATS 230 is also supplied by a separate generator 270 that operates during failure of (or unreliable periods of supply from) utility power delivery gear 280 or the relevant breaker 250. In this embodiment, up to three chilled water loops 290 are driven by a chilled water plant 295 that is powered by an ATS 230 with its own breaker 250 and generator 270, which are dedicated to HVAC and building envelope power. Said another way, one breaker 250 from each utility power delivery gear 280 supplies power for multiple chilled water plants 295, which provides cooling through a chilled water loops 290 to air handlers (see FIG. 4) situated throughout the facility to manage the ambient temperature around server groups 210.

It might be observed that, in the configuration illustrated in FIG. 2, each ATS 230 is supplied by its own breaker 250 and generator 270, and it feeds a single UPS 220, which directly supplies two server groups 210. In this configuration and many others that will occur to those skilled in the art in view of the present disclosure, there is no synchronization bus, and there is minimal opportunity for a fault in one part of the system 200 to propagate to another part.

Figure 3:
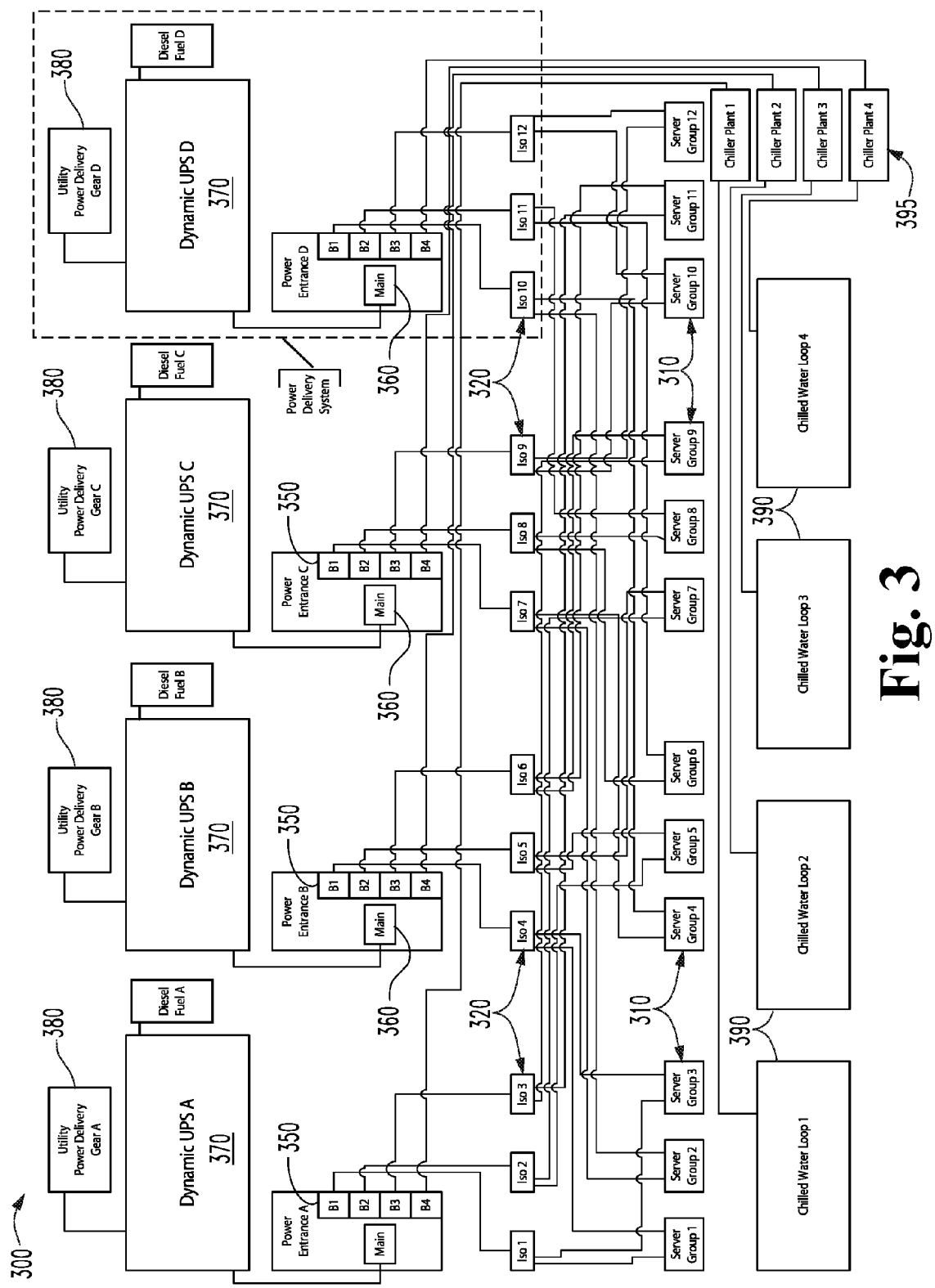
FIG. 3 is a schematic view of an alternative power distribution system for the data center illustrated in FIG. 1.

An alternative example system 300, illustrated in FIG. 3, uses integrated, "dynamic UPS" devices 370 at the utility end of the power distribution system in place of the UPSs 220 shown in system 200 of FIG. 2. In the embodiment illustrated in FIG. 3, servers 310 each receive power from two different isolation transformers ("ISOs") 320. Each ISO 320 in example system 300 is a 300 KVA 480V/208V step-down transformer, available from Square D, though other embodiments will use different ISOs as will occur to those skilled in the art.

Each ISO 320 receives power from one circuit breaker 350, which is supplied by a power main connection 360. Each power main connection 360 in this embodiment receives its power from a dynamic UPS 370. A dynamic UPS 370 comprises a motor that is normally powered by a utility power delivery gear 380 and maintains angular momentum of a flywheel. In the event of a utility power outage, the flywheel keeps the motor going as a standby engine turns on and gets up to speed, typically within 2-3 seconds. At that point, the engine drives the motor until utility power is restored or it runs out of fuel. Other embodiments will use different dynamic UPS systems as will occur to those skilled in the art.

Similar to system 200, system 300 uses power from one breaker 350 from each power main connection 360 to run chiller plants 395, and each chiller plant 395 operates a chilled water loop 390. Chilled water loops 390 provide cooling to air handlers (not shown) positioned throughout the facility of system 300.

As can be seen in these two example embodiments, power from gen-sets feeds UPSs or ISOs, which in turn feed servers, all without going through a synchronization bus. This design reduces or removes feedback potential and the risk of a cascade failure across components in the power distribution system. These reduced or removed failure modes improve reliability and simplify maintenance of the system relative to many designs in the existing art.

Being able to continually maintain equipment is just as important in the HVAC area as it is with generators and UPS's. Many data center implementations ignore the chilled water delivery system when designing and building facility redundancy. Exemplary chilled water loops 390 and chiller plant 395 are illustrated as cooling system 400 in FIG. 4. Here, compressor 410, condenser 420, and evaporator 430 operate as a traditional cooling circuit that is specified, sized, and installed as will be understood by those skilled in the art in view of this disclosure and the requirements of the particular implementation. Condenser 420 is assisted by pump 422, which moves fluid through outside heat exchanger 424 and back to condenser 420.

Figure 4:
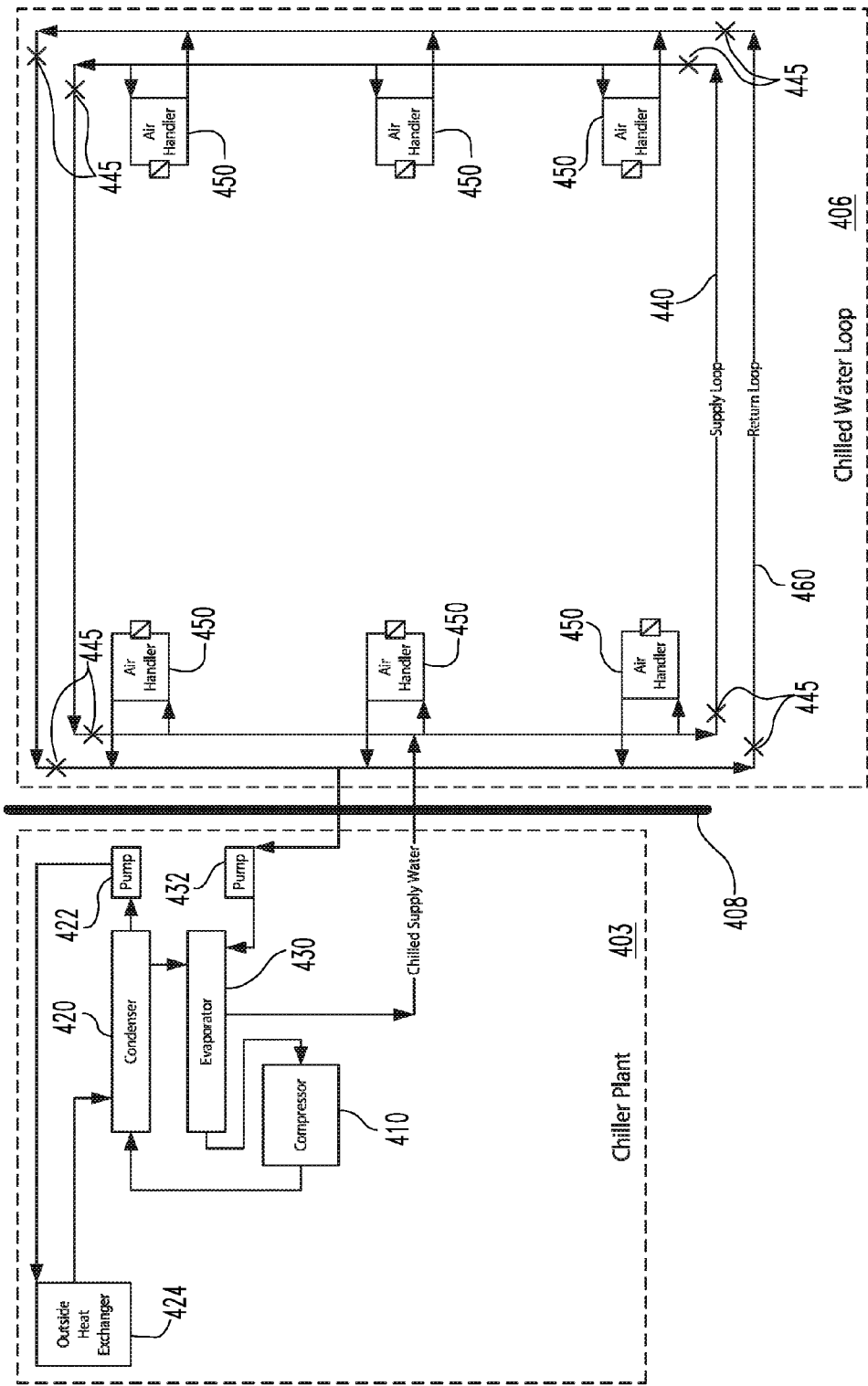
FIG. 4 is a schematic view of a chilled-water cooling system for use in the various disclosed embodiments.

In some embodiments, a single chiller plant 403 supplies chilled water to multiple chilled water loops 406 by way of a "super loop" and isolation manifold, collapsed and rendered as item 408 in FIG. 4. Operation of super loop/isolation manifold 408 is explained further below. In other embodiments, the chiller plant 403 supplies chilled water to only one chilled water loop 406, in which case no super loop/isolation manifold 408 is needed.

Evaporator 430 supplies chilled supply water to supply loop 440, which circulates the chilled water to each of a plurality of air handlers 450. After passing through an air handler 450, water returns to the return loop 460 and, via pump 432, to evaporator 430. Each of supply loop 440 and return loop 460 includes valves 445 that can be used to close portions of the respective loop off from the rest of the chilled water system 400. Using valves 445, a leak in one of the lines or components can be isolated and repaired while the rest of that loop 440 continues to carry chilled water to the plurality of air handlers 450. Of course, more or fewer valves can be used than are shown in FIG. 4, as will occur to those skilled in the art in view of this disclosure.

Figure 5:
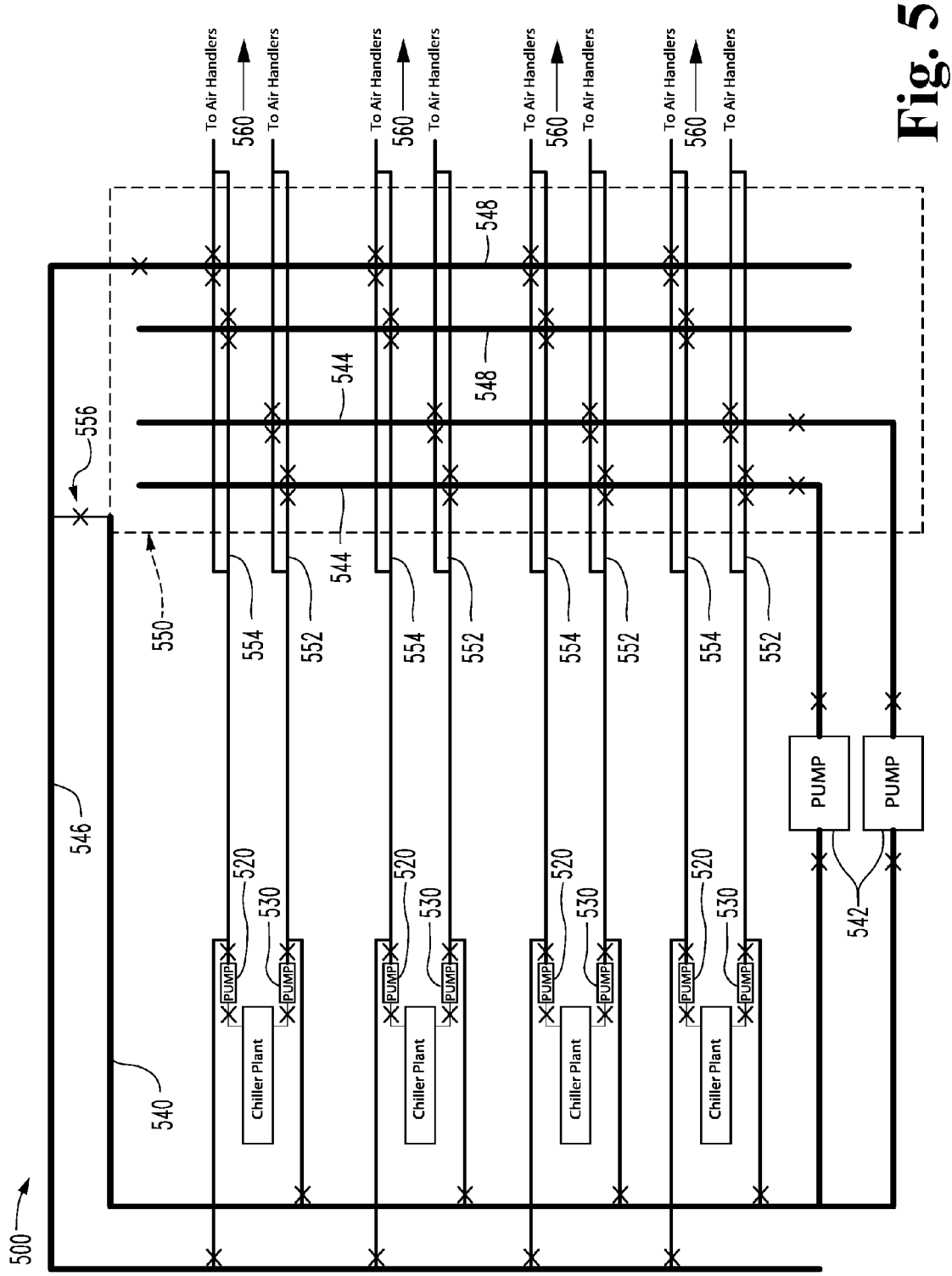
FIG. 5 is a schematic view of an alternative chilled-water cooling system for use in for use in the various disclosed embodiments.

Some alternative embodiments, like chilled water system 500 shown in FIG. 5, are designed with more redundancy and an isolation manifold that acts as a distribution layer between the chiller plants and air handlers. These structures give system operators the ability to valve off most sections of the system so that repairs can be made while the rest of the system continues to operate. In this example, each of a plurality of chiller plants 510 receives return water through return pumps 520 and provides chilled supply water through supply pumps 530. After passing through a supply pump 530, the chilled supply water proceeds to super-loop supply portion 540 and/or a supply branch pair 552 through isolation manifold 550. Super-loop supply portion 540 leads chilled supply water to super-loop pumps 542, which move the chilled supply water to super-loop manifold supply lines 544 in isolation manifold 550. The interconnections between supply branch pairs 552 and super-loop manifold supply lines 544 (and the valves in the supply branch pairs 552 on either side of those interconnections) enable a subset of chiller plants 510 to supply chilled water to all of the downstream air handlers 560.

Water returning from air handlers 560 comes back to isolation manifold 550 at return branch pairs 554, each pair feeding a return pump 520, which (depending on the status of various valves) may also receive return water through super-loop return portion 546. Return branch pairs 554 are selectively interconnected with super-loop manifold return portions 548, which feed super-loop return portion 546 for flow back to one or more return pumps 520. Super-loop return portion 546 is connected by valve 556 to super-loop supply portion 540 so that the thermal load on the chiller plants can be managed with more precision. Again, more or fewer interconnections and/or valves will be included in various systems as will occur to those skilled in the art.

By allowing any chilled water loop to receive adequate chilled water from any chiller plant, any chiller plant can be taken offline and repaired without interrupting the cooling process in the facility's operational space. This configuration also enables leaks to be more easily isolated and repaired without interrupting the cooling process on the computer floor.

Figure 6:
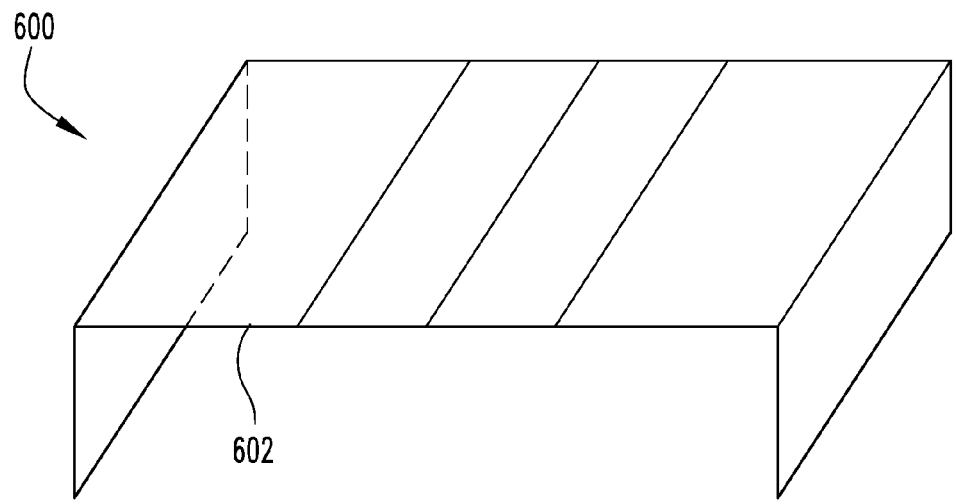
FIG. 6 is an isometric view of a supporting frame for a fan coil unit for use with the various disclosed embodiments.
Figure 7:
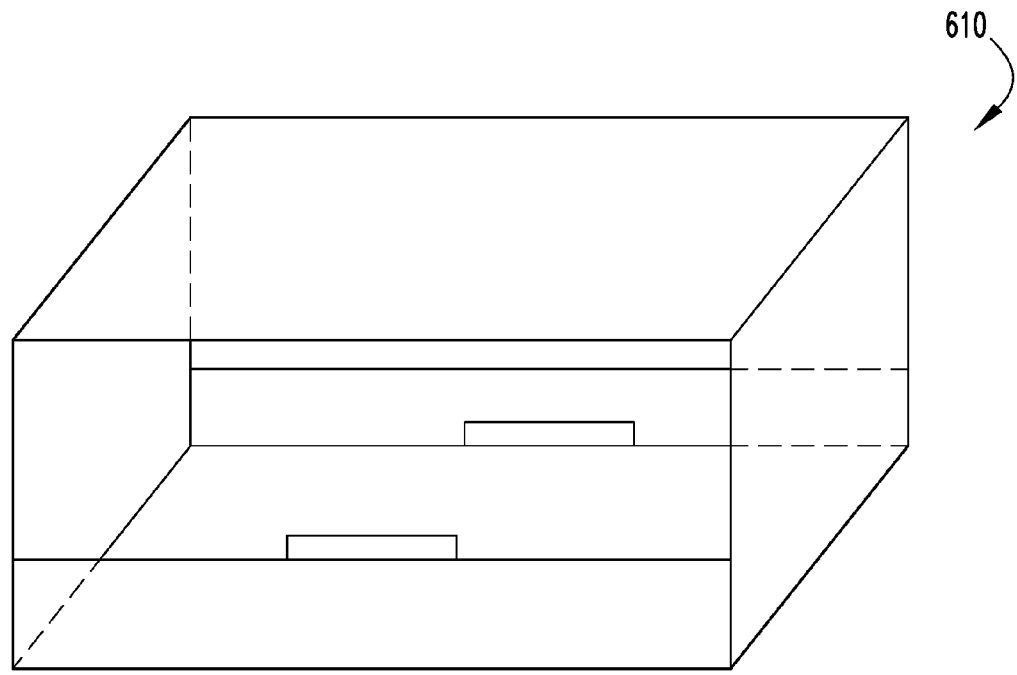
FIG. 7 is an isometric view of a housing for the fan coil of FIG. 6.
Figure 8:
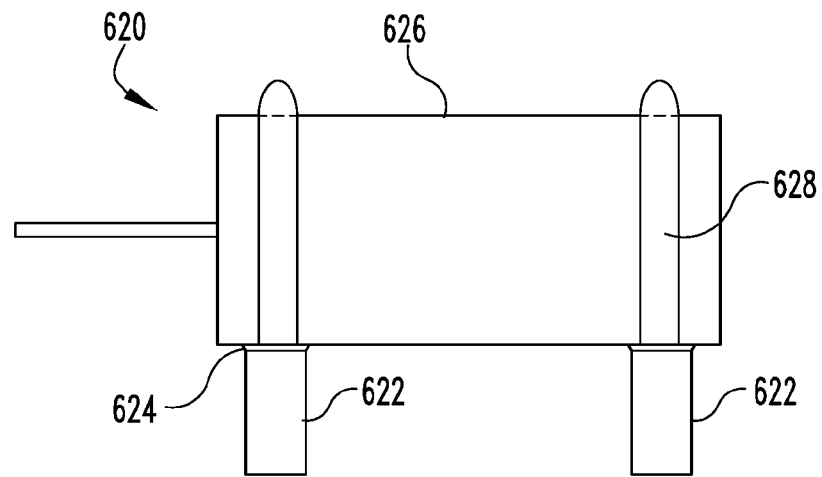
FIG. 8 is a side view of a motor assembly for the fan coil of FIG. 6.

Exemplary frame 600 in FIG. 6 is a stand for a fan coil unit that can be used in some embodiments of the present system. Frame 600 in this embodiment is constructed of tube steel and creates a "bottom" platform between pieces 602. Housing 610 in FIG. 7 will be assembled to surround the components of the fan coil unit. Motor assembly 620 in FIG. 8 is placed on UNISTRUT frame 622, separated at each contact point by one or more rubber vibration pads 624. Strut clamps/straps 628 securely attach motor 626 to UNISTRUT frame 622.

Figure 9:
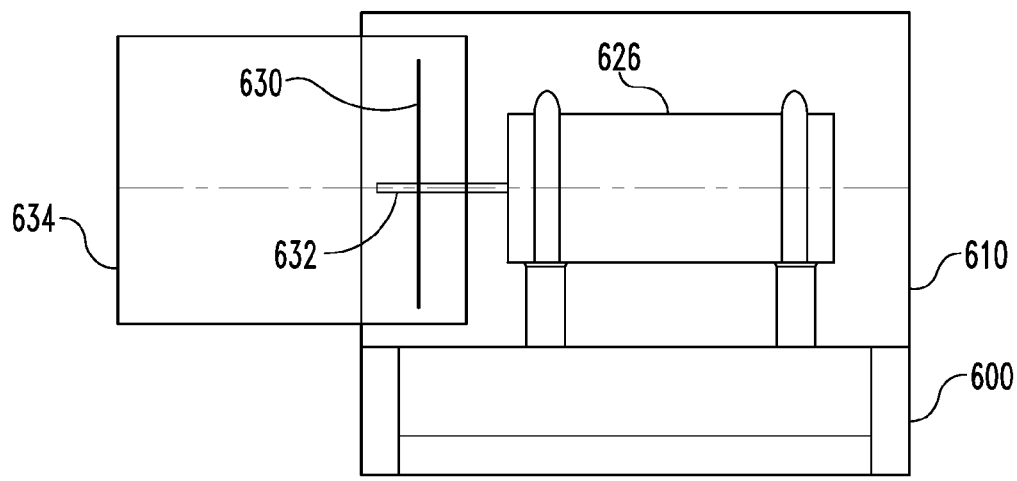
FIG. 9 is a side view of a shroud for the fan coil of FIG. 6.
Figure 10:
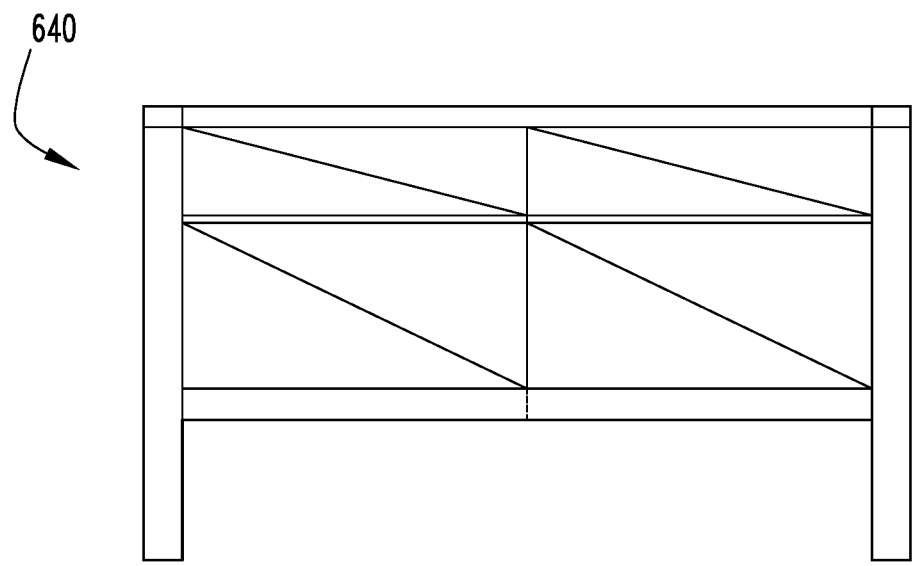
FIG. 10 is a back view of a filter rack for use with the fan coil of FIG. 6.

Turning to FIG. 9, motor 628 is illustrated on a frame 600 inside housing 610. Blade 630 is mounted on shaft 632 inside shroud 634. Silicone caulk seals the interface between shroud 634 and housing 610 to deter the escape of water from inside housing 610. FIG. 10 illustrates a filter rack 640 designed to be placed at the back of the fan coil unit to hold air filters operable to clean the intake air for the unit.

Figure 11:
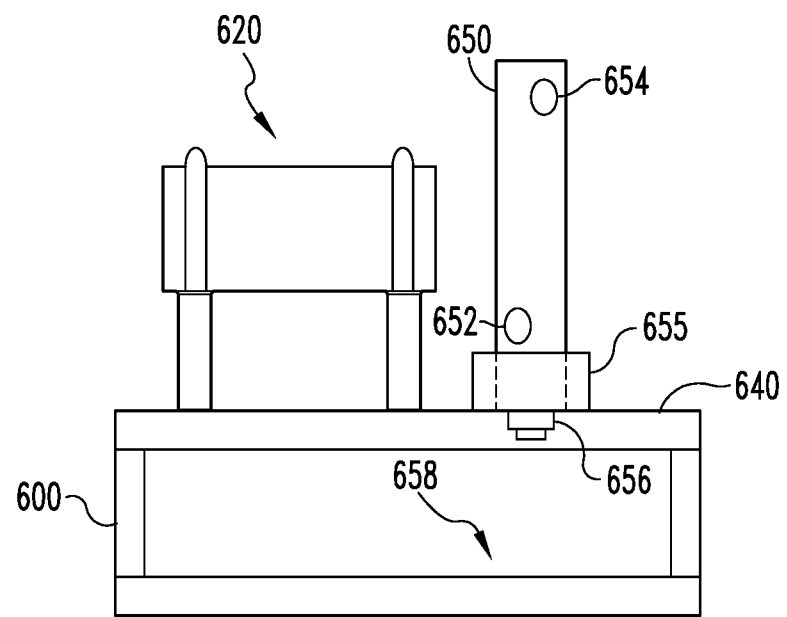
FIG. 11 is a side view of a coil for use with the fan coil of FIG. 6.

FIG. 11 illustrates an assembled fan coil unit, including motor assembly 620, frame 600, a space for a filter rack 640, and cooling coil 650 with supply line 652 and return line 654. So assembled, blade 630 rotates within shroud 634 on shaft 632 (all shown in FIG. 9) by rotation applied to shaft 632 by motor assembly 620. This draws air through filter rack 640 (see FIG. 10) and coil 650 (in FIG. 11), where it is cooled before being moved out into the facility's operational space through shroud 634. Waterproof pan 655 and drain spout 656 lead condensation and any water escaping from leaks in coil 650 down to a pump (not shown) that conducts the water to a reservoir, or to pan 658, which may be outfitted with absorbent material and/or moisture sensors that set off audio, visual, and/or data alarms when moisture is detected.

Of course, alternative fan coil unit designs can be used with the systems described herein and will occur to those skilled in the art in view this disclosure. In some of them, moisture is managed and contained within the footprint of the unit.

All publications, prior applications, and other documents cited herein are hereby incorporated by reference in their entirety as if each had been individually incorporated by reference and fully set forth. While exemplary systems have been illustrated and described in detail in the drawings and foregoing description, the same is to be considered as illustrative and not restrictive in character, it being understood that only certain preferred embodiments have been shown and described and that all changes and modifications that come within the spirit of the invention are desired to be protected.

What is claimed is:

1. A computing facility power distribution system, comprising:
    a first power path and a second power path configured to transmit power simultaneously, each comprising a main power delivery gear, a circuit breaker, an automatic transfer switch (ATS), a gen-set, and a member uninterruptible power supply (UPS), wherein:
        the main power delivery gear provides power through the circuit breaker to a first input of the ATS;
        the gen-set has an output that provides power to a second input of the ATS; the ATS provides power to the UPS;
        none of the power traveling through the first power path travels through the second power path; and
        none of the power traveling through the second power path travels through the first power path; and
    a first load device that receives power from both the UPS in the first power path and the UPS in the second power path.

2. The power distribution system of claim 1, further comprising a power monitor configured to detect when insufficient power is reaching the ATS from the breaker and, in response, start up the gen-set.

3. The power distribution system of claim 1, further comprising:
    a second load device that receives power from the UPS in the first power path, but no power from the second power path; and
    a third load device that receives power from the UPS in the second power path, but no power from the first power path.

4. The power distribution system of claim 1,
    further comprising a cooling system that receives power from a third power path, the third power path comprising a main power delivery gear, a circuit breaker, an ATS, a gen-set, and an UPS,
    and wherein, in the third power path:
    the main power delivery gear provides power through the circuit breaker to a first input of the ATS;
    the gen-set has an output that provides power to a second input of the ATS; and
    none of the power traveling through the ATS in the third power path travels through the ATS in the first power path nor the ATS in the second power path.

5. The power distribution system of claim 1, further comprising:
    a third power path and a fourth power path, each comprising a main power delivery gear, a circuit breaker, an automatic transfer switch (ATS), a gen-set, and an uninterruptible power supply (UPS); and
    a first cooling system and a second cooling system that receive power from the third power path and the fourth power path, respectively;
    and wherein:
    in the third power path and the fourth power path, the main power delivery gear provides power through the circuit breaker to a first input of the ATS;
    in the third power path and the fourth power path, the gen-set has an output that provides power to a second input of the ATS;
    none of the power traveling through the ATS in the third power path travels through the ATS in the first power path nor the ATS in the second power path;
    none of the power traveling through the ATS in the fourth power path travels through the ATS in the first power path nor the ATS in the second power path; and
    at least one of the first cooling system and the second cooling system provides cooling to the first load device.

6. The power distribution system of claim 5, further comprising:
    a supply water manifold that is supplied by both the first cooling system and the second cooling system;
    a return water manifold that returns water to both the first cooling system and the second cooling system; and
    one or more air handlers that draw water from the supply water manifold, return water to the return water manifold, and cool air in the vicinity of the first load device.

7. The power distribution system of claim 6, further comprising:
    a plumbing network that carries water between the first cooling system, the second cooling system, the supply manifold, and the return manifold; and
    a plurality of valves positioned in the plumbing network effectively to selectively remove one of the first cooling system and the second cooling system from the system while permitting the other one of the first cooling system and the second cooling system to continue to supply the supply manifold and receive return fluid from the return manifold.

8. The computing facility power distribution system of claim 1, wherein the main power delivery gear comprises a utility power delivery gear; and wherein the ATS is a standalone ATS and has only two inputs.

9. A computing facility power distribution system, comprising:
a first power path and a second power path configured to transmit power simultaneously, each comprising a circuit breaker and an isolation transformer (ISO), wherein the ISO receives power from the circuit breaker; and wherein
none of the power traveling through the first power path travels through the second power path; and
none of the power traveling through the second power path travels through the first power path; and
a first load device that receives power from both the ISO in the first power path and the ISO in the second power path.

10. The power distribution system of claim 9, further comprising a dynamic UPS that receives utility power and provides it to the circuit breaker of one or more of the power paths.

11. The power distribution system of claim 9, further comprising:
a second load device that receives power from the ISO in the first power path, but no power from the second power path; and
a third load device that receives power from the ISO in the second power path, but no power from the first power path.

12. A facility having the power distribution system of claim 9, further comprising:
a cooling system that receives power from a third power path, the third power path comprising a circuit breaker and an ISO;
and wherein
the circuit breaker provides power to the ISO; and
none of the power traveling through the ISO in the third power path travels through the ISO in the first power path nor the ISO in the second power path.

13. A facility having the power distribution system of claim 9, further comprising:
a third power path and a fourth power path, each comprising a circuit breaker that supplies power to an ISO; and
a first cooling system and a second cooling system that receive power from the third power path and the fourth power path, respectively;
and wherein:
none of the power traveling through the ISO in the third power path travels through the ISO in the first power path nor the ISO in the second power path;
none of the power traveling through the ISO in the fourth power path travels through the ISO in the first power path nor the ISO in the second power path; and
at least one of the first cooling system and the second cooling system provides cooling to the first load device.

14. A facility having the power distribution system of claim 13, further comprising:
a supply water manifold that is supplied by both the first cooling system and the second cooling system;
a return water manifold that returns water to both the first cooling system and the second cooling system; and
one or more air handlers that draw water from the supply water manifold, return water to the return water manifold, and cool air in the vicinity of the first load device.

15. The facility of claim 14, further comprising:
a plumbing network that carries water between the first cooling system, the second cooling system, the supply manifold, and the return manifold; and
a plurality of valves positioned in the plumbing network effectively to selectively remove one of the first cooling system and the second cooling system from the system while permitting the other one of the first cooling system and the second cooling system to continue to supply the supply manifold and receive return fluid from the return manifold.

16. The computing facility power distribution system of claim 9, wherein the ISO in the first power path is electrically coupled between the first load device and the circuit breaker in the first power path; and
wherein the ISO in the second power path is electrically coupled between the first load device and the circuit breaker in the second power path.

17. A method of constructing a power distribution system for a computing facility, comprising the steps of:
connecting the output of a first circuit breaker to an input of a first isolation unit, wherein the first circuit breaker receives power from a first utility gear;
connecting the output of a second circuit breaker to an input of a second isolation unit, wherein the second circuit breaker receives power from a second utility gear;
connecting a first output of the first isolation unit to a first power input of a first load device; and
connecting a first output of the second isolation unit to a second power input of the first load device;
wherein the first isolation unit and the second isolation unit are each selected from the group consisting of:
an isolation transformer, and
an uninterruptable power supply;
wherein no power that passes through the first isolation unit enters the second power input; and
wherein no power that passes through the second isolation unit enters the first power input; and further comprising:
powering a cooling system through a third circuit breaker and a third isolation unit; and wherein
the third circuit breaker provides power to the third isolation unit; and
none of the power traveling through the third isolation unit travels through the first isolation unit nor the second isolation unit.

18. The method of claim 17, further comprising:
connecting a second load device to a second output of the first isolation unit, where the second load device does not receive power through the second isolation unit; and
connecting a third load device to a second output of the second isolation unit, where the third load device does not receive power through the first isolation unit.

19. A method of constructing a power distribution system for a computing facility, comprising the steps of:
connecting the output of a first circuit breaker to an input of a first isolation unit, wherein the first circuit breaker receives power from a first utility gear;
connecting the output of a second circuit breaker to an input of a second isolation unit, wherein the second circuit breaker receives power from a second utility gear;
connecting a first output of the first isolation unit to a first power input of a first load device; and
connecting a first output of the second isolation unit to a second power input of the first load device;

wherein the first isolation unit and the second isolation unit are each selected from the group consisting of:
an isolation transformer, and
an uninterruptable power supply;
wherein no power that passes through the first isolation unit enters the second power input; and
wherein no power that passes through the second isolation unit enters the first power input; and further comprising:
connecting an output of a third circuit breaker to an input of a third isolation unit;
connecting an output of a fourth circuit breaker to an input of a fourth isolation unit; and
powering a first cooling system and a second cooling system from the third isolation unit and the fourth isolation unit, respectively;
and wherein:
none of the power traveling through the third isolation unit travels through the first isolation unit nor the second isolation unit;
none of the power traveling through the fourth isolation unit travels through the first isolation unit nor the second isolation unit;
at least one of the first cooling system and the second cooling system provides cooling to the first load device; and
the third isolation unit and the fourth isolation unit are each selected from the group consisting of:
an isolation transformer, and
an uninterruptable power supply.

20. The method of claim 19, further comprising:
supplying a supply water manifold from both the first cooling system and the second cooling system;
returning water from a return water manifold to both the first cooling system and the second cooling system;
supplying water to one or more air handlers from the supply water manifold; and
accepting return water from the one or more air handlers at the return water manifold, and
producing cool air from the one or more air handlers in the vicinity of the first load device.

* * * * *